United States Patent [19]
Fernandes et al.

[11] Patent Number: 5,310,626
[45] Date of Patent: May 10, 1994

[54] METHOD FOR FORMING A PATTERNED LAYER USING DIELECTRIC MATERIALS AS A LIGHT-SENSITIVE MATERIAL

[75] Inventors: Mark G. Fernandes, Austin; Stanley M. Filipiak, Pflugerville; Jeffrey T. Wetzel, Austin, all of Tex.

[73] Assignee: Motorola, Inc., Schaumburg, Ill.

[21] Appl. No.: 24,027

[22] Filed: Mar. 1, 1993

[51] Int. Cl.[5] ................................................ G03C 5/00
[52] U.S. Cl. ..................................... 430/327; 430/311; 430/322
[58] Field of Search ............... 430/311, 322, 323, 314, 430/315, 316, 317, 5, 270

[56] References Cited
U.S. PATENT DOCUMENTS
4,737,446  4/1988  Cohen et al. ..................... 430/319

Primary Examiner—Steve Rosasco
Attorney, Agent, or Firm—Keith E. Witek

[57] ABSTRACT

A method for forming a patterned layer of material begins by providing a substrate (12). A device layer (14) is formed overlying the substrate (12). A layer (16) is formed over the device layer (14). Layer (16) is further characterized as being an inorganic dielectric material, such as a plasma enhanced silicon nitride (PEN) material. A mask (18) is positioned adjacent the layer (16). Ultra-violet (UV) light (20) is selectively exposed to the layer (16) through the mask (18). Exposure from the UV light (20) forms exposed regions (16b) and unexposed regions (16a) of the layer (16). The UV light (20) alters an atomic bonding energy of hydrogen atoms within the exposed regions (16b) while not altering unexposed regions (16a). The layer (16) is exposed to an etchant which etches the exposed regions (16b) and unexposed regions (16a) at different rates. The etching forms a patterned layer from the layer (16) which may be used as a masking layer.

39 Claims, 6 Drawing Sheets

METHOD FOR FORMING A PATTERNED LAYER USING DIELECTRIC MATERIALS AS A LIGHT-SENSITIVE MATERIAL

FIELD OF THE INVENTION

The present invention relates generally to semiconductor technology, and more particularly, to lithographic processing.

BACKGROUND OF THE INVENTION

Photolithographic processing is an important technology in the manufacturing of integrated circuits (ICs). Photolithography, or like lithographic techniques (i.e. X-ray lithography, E-beam exposure, phase shift technology, etc.), is usually used several times during the course of fabricating an integrated circuit wafer.

Conventionally, photolithography requires that a layer of organic photoresist be formed over the IC wafer. This photoresist or resist is typically applied by spraying an organic light-sensitive photoresist over the IC wafer while the wafer is being rotated at a predetermined number of rotations per minute (RPM). The RPM is selected to provide a photoresist layer which has a relatively planar topography and thickness.

In most cases, after photoresist is applied to an IC wafer, the IC wafer and photoresist layer are exposed to a thermal heat cycle or a like thermal step. This heat cycle, known also as a "soft bake", bakes the photoresist onto the IC wafer surface to ensure adequate photoresist adhesion and limited subsequent photoresist peeling.

A mask, usually made of chromium opaque regions and a quartz substrate, is positioned over the IC wafer. A lamp or like energy source selectively exposes portions of the photoresist layer on the IC wafer through the mask. The light exposure alters the molecular weight of exposed portions of the photoresist layer while leaving the molecular weight of unexposed portions unchanged.

A solution or chemical, known also as a "developer", is then used to "develop" or etch the photoresist. The developer etches the photoresist selectively as a function of the molecular weight. Some developers etch photoresist molecules having a low molecular weight, and other developers etch photoresist molecules having a high molecular weight. By using the developer, a masking pattern defined by the mask is transferred to the photoresist layer which overlies the IC wafer. In some cases, a "hard bake" is performed after the photoresist development step to bake the photoresist a second time.

The photoresist pattern which overlies the IC wafer is then used to etch or form patterns/regions in layers which underlie the photoresist. Once the photoresist has been used to form IC patterns in underlying layers, an etch step is used to remove all portions of the photoresist. Known ash steps, wet etch techniques, cleaning cycles, de-ionized water rinses, and/or like processes are used to clean the IC wafer after being exposed to photoresist.

Although photoresist is used extensively in IC processing, photoresist has some disadvantages. Photoresist processing, as indicated above, requires many processing steps. Also photoresist is a source of unwanted IC contaminants such as metal contaminants and sodium. Exposing photoresist to certain etch chemistries, plasma environments, and the like may create undesirable organic layers known as "veils" or "scum" which overlie an IC wafer. These undesirable organic layers are difficult to remove and may reduce yield or increase contact resistance. Other known problems with photoresist, such as reflective notching, etc., exist in the art.

Another material which may be patterned in a manner similar to photoresist is polyimide. Polyimide is an organic material and is susceptible to contamination in a manner similar to photoresist. Polyimide is also not an adequate diffusion barrier, is difficult to control in terms of film thickness, has stress-related problems, and does not have adequate sub-micron resolution capabilities.

Therefore, an improved lithographic process and lithographic material is desired.

SUMMARY OF THE INVENTION

The previously mentioned disadvantages are overcome and other advantages achieved with the present invention. In one form, the present invention comprises a method for forming a patterned layer of material overlying an integrated circuit substrate. The method begins by forming an inorganic dielectric layer overlying the integrated circuit substrate. The inorganic dielectric layer is a material which is physically modified in response to an energy source exposure. The inorganic dielectric layer is selectively exposed to an energy source radiation wherein portions of the inorganic dielectric layer are chemically altered by the energy source radiation to create exposed inorganic dielectric layer portions and unexposed inorganic dielectric layer portions. Regions of the inorganic dielectric layer are selectively removed to form the patterned layer of material wherein the regions of the inorganic dielectric layer which are removed are one of either the exposed inorganic dielectric layer portions or the unexposed inorganic dielectric layer portions.

In another form, the present invention comprises a method for forming an opening. A topographical surface is formed overlying a substrate. The topographical surface has a recessed region. A conformal dielectric layer is formed overlying the topographical surface. A plug region is formed overlying the conformal dielectric layer and at least partially within said recessed region. The conformal dielectric layer is exposed to energy source radiation using the pulug region as a masking layer. The exposure forms first portions of the conformal dielectric layer and second portions of the conformal dielectric layer, wherein the first portions are exposed to a first intensity of energy unequal to a second intensity of energy which the second portions are exposed to. The first portions of the conformal dielectric layer are removed to form said opening in the conformal dielectric layer.

In yet another form, the present invention comprises a method for forming a patterned layer overlying a substrate. An inorganic dielectric layer of material is formed overlying said substrate. The inorganic dielectric layer of material is selectively exposed to an energy source to form exposed portions of the inorganic dielectric layer of material and unexposed portions of the inorganic dielectric layer of material. The exposed portions of the inorganic dielectric layer of material have a first atomic bond energy which is different from a second atomic bond energy of the unexposed regions.

The present invention will be more clearly understood from the detailed description below in conjunction with the accompanying drawings.

DESCRIPTION OF A PREFERRED EMBODIMENT

Figure 1:
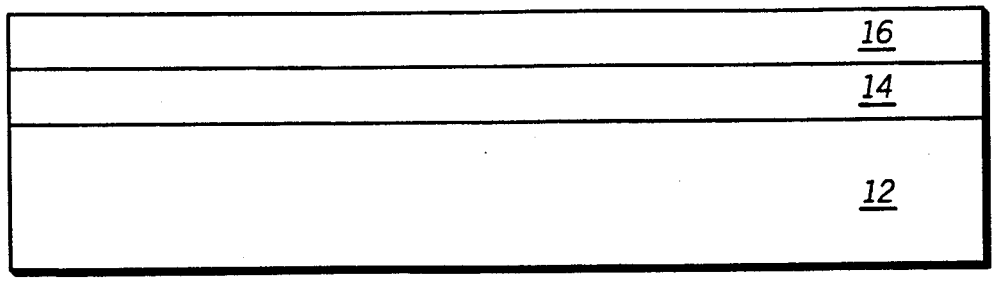
FIGS. 1–3 illustrate, in cross-sectional form, a method for forming a patterned layer in accordance with the present invention.

Illustrated in FIG. 1 is a structure suitable for the formation of a patterned layer in accordance with the present invention. FIG. 1 illustrates a substrate 12. Substrate 12 may be made of silicon, gallium aresenide, silicon on sapphire (SOS), epitaxial formations, germanium, germanium silicon, diamond, silicon on insulator (SOI) material, and/or like substrate materials. Preferably, the substrate 12 is made of single-crystalline silicon. The substrate 12 may contain buried layers, diffusions, transistor electrodes, trench regions, wells, and the like. A device layer 14 is formed overlying the substrate 12. The device layer 14 may be a single layer, such as a gate oxide or a field oxide, or may be a plurality of vertically stacked layers such as polysilicon gates, amorphous silicon regions, a semiconductive layer, epitaxial silicon, metal layers, silicides, salicides, oxides, interconnects, inter-level dielectrics, isolation formations, active devices, passive devices, and/or the like. Device layer 14 is intended to illustrate that the methods taught herein may be performed at any level within an integrated circuit. In some cases, device layer 14 may be considered a top portion of the substrate 12 (i.e. no intervening layers are overlying the substrate 12).

Device layer 14 may have either a planar top surface or an integrated circuit surface which has a non-planar surface topography. A non-planar surface topography is any topography which is not completely planar, but instead has some "hills" and "valleys." The valleys are referred to as recessed regions herein.

In FIG. 1, a layer 16 is formed overlying the device layer 14. Layer 16 is one of either an inorganic material, an inorganic dielectric material, a nitride material (i.e. boronitride, borooxynitride, silicon nitride, plasma enhanced silicon nitride (PEN), oxynitride, and like nitride materials), a layer which is sensitive to ultra-violet (UV) light, or the like. A layer which is sensitive to UV light is any material which is altered chemically or mechanically via exposure to UV light energy source. For example, the molecular weight of molecules within the layer may change, atomic bonding energies between atoms may change, chemical composition of molecules may change, etch selectivity or etch rates of the layer may change, film stress may be altered, and/or the like. In most cases, the layer 16 is a conformal film of material which ranges in thickness from tens of angstroms to thousands of angstroms. In a preferred form, layer 16 is a PEN layer which is roughly a few hundred to a few thousand angstroms in thickness. Layer 16 may be formed by deposition, growth, or selective deposition processes.

Figure 2:
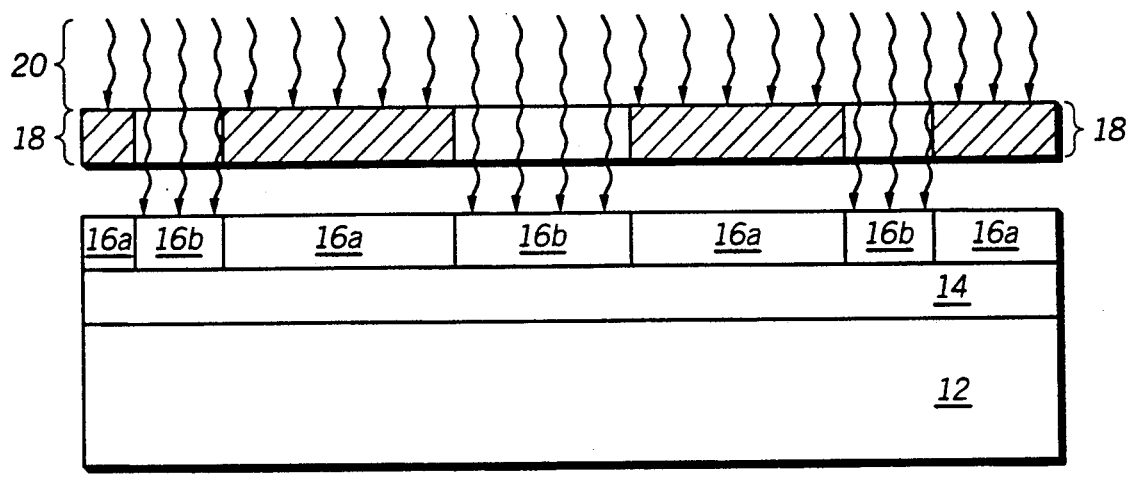

In FIG. 2, a mask 18 is positioned overlying or adjacent the layer 16. In some semiconductor equipment systems, the substrate 12 and the mask 18 are positioned laterally adjacent each other. The mask 18, as illustrated in FIG. 2, has cross-hatched opaque/dark regions through which light cannot pass, and has clear regions which allow light or energy to pass. In the art, several types of masks and mask making techniques exist, all of which are applicable in FIG. 2. In general, opaque regions are formed by a patterned chromium region and opaque regions are each formed by an exposed quartz substrate area.

In FIG. 2, an energy source is exposed through the mask 18 to selectively expose the layer 16. Preferably, ultra-violet (UV) light 20 is used to expose the layer 16, although other energy sources exist. Experimentally it has been found that if the layer 16 is made of plasma enhanced nitride (PEN), then an optimal wavelength for the light 20 would be less than 405 nanometers. Specifically, a wavelength of 254 nanometers has a strong effect on PEN stress and/or atomic bonding energy of atoms within PEN due to the presence of hydrogen bonds in PEN. Any material having a measurable or substantial quantity of hydrogen bonds will be affected by the UV light source operating at a wavelength of 254 nanometers. For best UV light results, the hydrogen bonds should be weak bonds (i.e. weaker than other atomic bonds in the film of material). In general, the UV exposure must be of a high intensity, or of a long time duration if the UV light source is weak. The mask 18 forms exposed regions 16b and unexposed regions 16a of the layer 16 by selectively controlling an amount of light intensity which passes as illustrated. The UV light which is subjected to exposed regions 16b causes the regions 16b to undergo a chemical, atomic, and/or mechanical change. In the case of PEN, the atomic bonding energy is changed in the exposed regions 16b when compared to the unexposed regions 16a.

The unexposed regions 16a and the exposed regions 16b have different etch rates and etch selectivities when exposed to an etchant due to the UV exposure. This difference in etch rates and etch selectivities may repair over time (i.e. several hours or days for a strong UV exposure). Therefore, the layer 16 must be etched within a predetermined time limit depending upon UV light exposure intensity and time.

Figure 3:
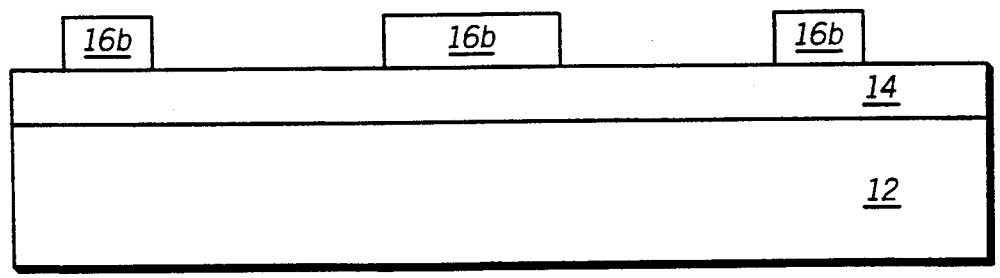

In FIG. 3, an etchant is used to remove the unexposed regions 16a, and leave behind the exposed regions 16b. The etchant is usually an HF solution, an HF vapor phase etch, or a known nitride dry etch process. An HF vapor etch and an HF wet etch having a composition of 100:1 (de-ionized water:HF) was used. Plasma etches which are more chemically active than mechanically active (i.e. which reduces the bombardment factor in the etching) will produce adequate selectivities as well. A patterned layer is therefore formed via layer 16. It is important to note that the formation of the patterned layer did not require the use of a photoresist layer. The patterned layer formed by exposed regions 16b may be used as a mask for underlying layers, may be an etch stop, may be used as an implant mask, may be used as an etch mask, may be used as a polishing mask, or can function in any manner similar to a photoresist masking layer.

Unexposed and exposed regions have been experimentally found to have etch rate differences which result in selectivities of greater than 3:1. The UV light exposure step has been experimentally found to alter hydrogen bonds to surrounding atoms (i.e. silicon, nitrogen, boron, etc.). If more ammonia ($NH_3$), or a like hydrogen containing gas source, is used to increase the hydrogen in the layer 16, greater selectivities are achieved. Exposure time and exposure energy also alters the selectivity.

By using an inorganic dielectric, such as a nitride material or nitrided material, for the patterned masking layer, several advantages result. Using photoresist in integrated circuit processing requires many processing steps (e.g. spin coat the photoresist, bake photoresist, expose photoresist, develop photoresist, optionally bake photoresist a second time, remove photoresist, clean organic veils, etc., off of wafer). The process described herein using an inorganic dielectric material only requires the deposition of the inorganic material, an exposure of the material, and an etch of the material. Due to the fact that the masking layer (i.e. exposed regions 16b) is a dielectric material, exposed regions 16b do not have to be removed like photoresist and can remain behind to provide added benefits, such as improved isolation or self-aligned structures.

An inorganic dielectric material such as silicon nitride can withstand much higher temperatures than photoresist, and is in general more robust than a photoresist film. The thickness of nitrides or like materials formed by chemical vapor deposition (CVD), low pressure CVD (LPCVD), plasma enhanced CVD (PECVD), selective processing, and the like, is a thickness which is much more controllable than photoresist, polyimides, or like spin-on materials. Unlike photoresists, inorganic dielectrics may be conformal in film coverage, or polished via resist etch-back or chemical mechanical polishing (CMP) to provide a locally or globally planarized layer of material. Inorganic dielectrics will usually contain less sodium and metal contaminants than photoresists or like organic materials.

Inorganic dielectrics may be patterned to small geometries in the sub-micron range. Inorganic dielectrics used as photo-masks are less likely to undergo thermal expansion/compression after patterning and will typically have less adhesion problems than photoresists and the like. Unlike polyimide, inorganic dielectrics, such as nitrides, make good diffusion barriers. Self-aligned structures may be formed using inorganic dielectrics as taught herein. By using nitrides and the like for photomask layers, costs are reduced. For example, nitride deposition equipment and nitride etch equipment are always available in a state-of-the-art IC fabrication facility. Therefore, the already available nitride equipment may replace photoresist spin-on equipment and corresponding expensive lithographic systems. Using nitride in general is more cost effective and will have greater throughput than a photoresist process.

Furthermore, inorganic dielectrics, such as nitride, can be controlled and deposited accurately from tens of angstroms to thousands of angstroms, unlike photoresist materials.

Figure 4:
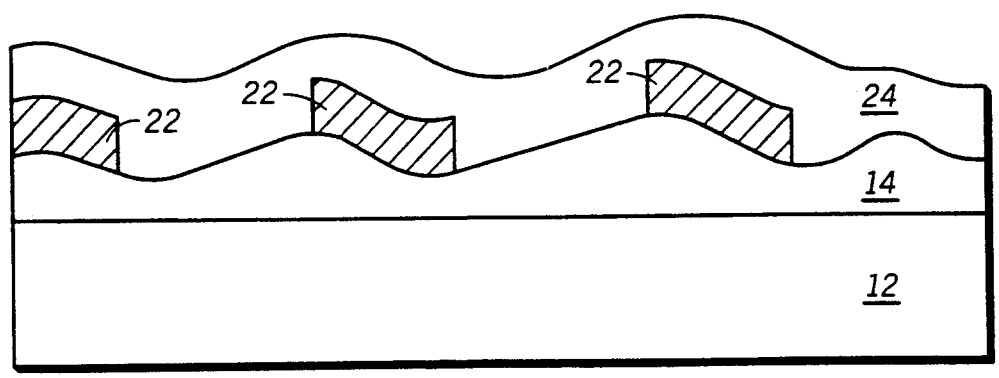
FIGS. 4–7 illustrate, in cross-sectional form, a method for forming an interconnect or a contact using a patterned layer in accordance with the present invention.

FIGS. 4-7 illustrate a method for forming a patterned layer in the form of a contact or a via in accordance with the present invention. In FIG. 4, substrate 12 and device layer 14 are illustrated. A patterned conductive layer 22 is illustrated. Conductive layer 22 may be a polysilicon layer, an amorphous silicon layer, an interconnect, a transistor electrode, a silicided/salicided layer, a metal layer, a conductive oxide, or a like conductive/semiconductive layer. An inter-level dielectric layer 24 is formed overlying the conductive layer 22. The dielectric layer 24 is typically a TEOS-based oxide.

Figure 5:
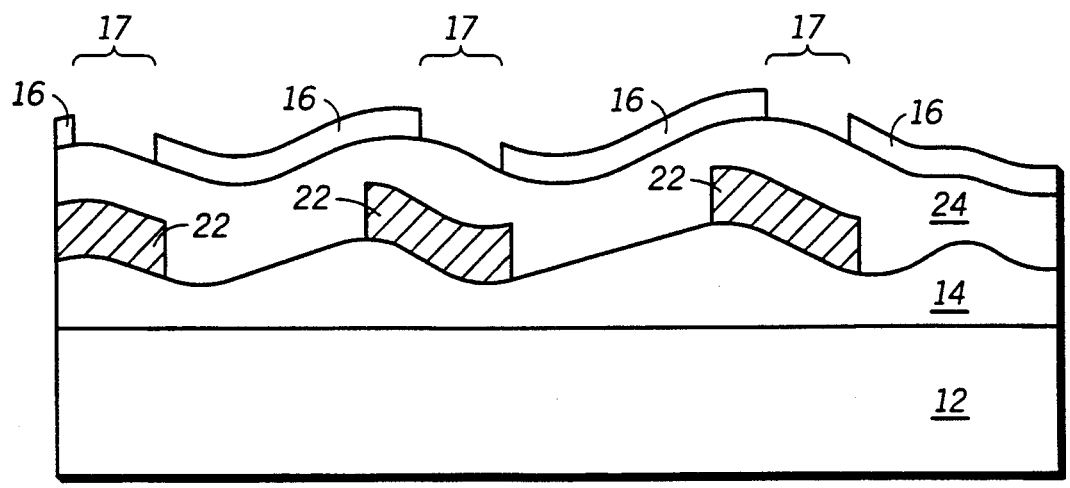

In FIG. 5, layer 16 is formed over the dielectric layer 24. Layer 16 is exposed to UV light and etched as taught in FIGS. 1-3. The steps illustrated in FIGS. 1-3 result in layer 16 being patterned as illustrated in FIG. 5. Layer 16 has a plurality of openings 17.

Figure 6:
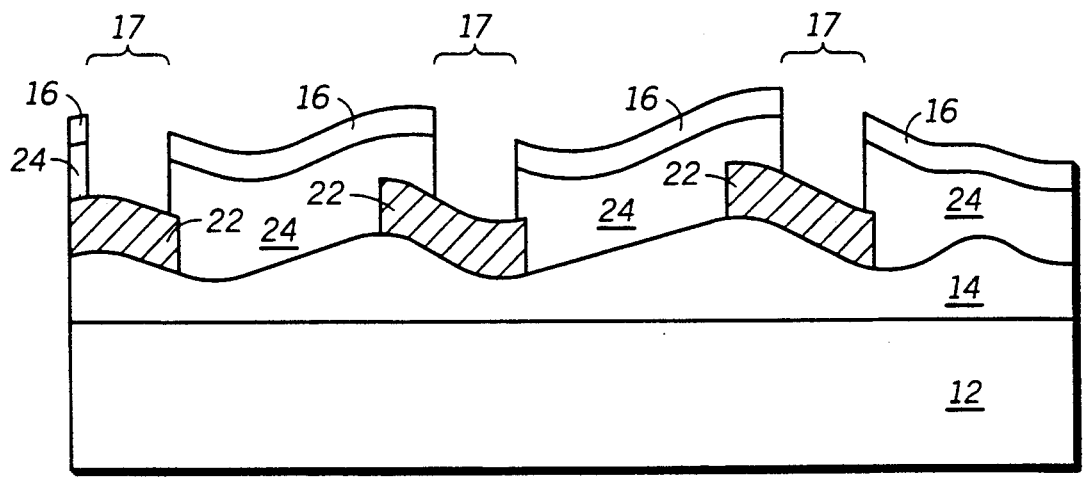

In FIG. 6, an etch process which etches dielectric layer 24 selective to layer 16 is used. The etch chemistry may be for example an HF wet etch, a $CHF_3/CF_4$ anisotropic process or a $C_2F_6$ anisotropic process. In the art, etch processes are currently being developed and used wherein oxide to nitride selectivities surpass 30:1. The etching illustrated in FIG. 6 deepens the openings 17 and exposes the portions of the conductive layer 22 as illustrated.

Figure 7:
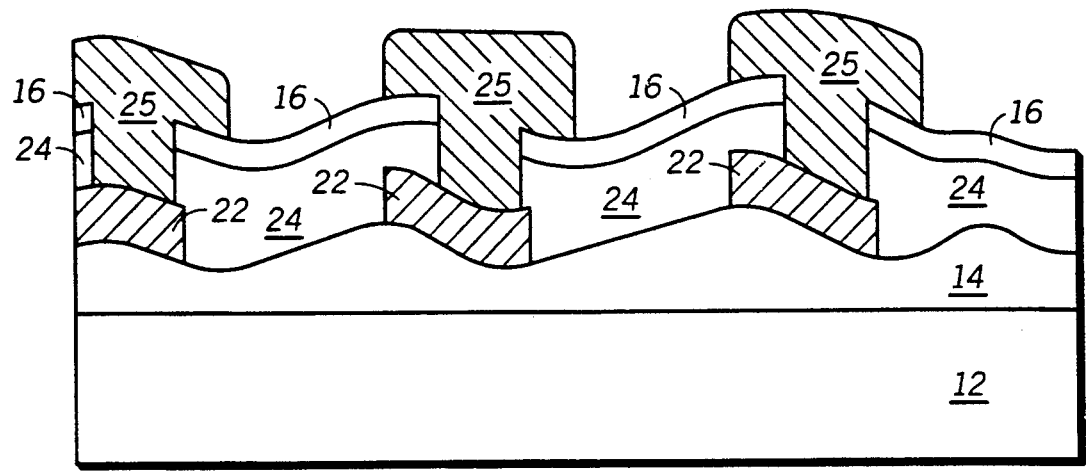

In FIG. 7, a second conductive layer 25 is formed overlying and electrically connected to the conductive layer 22. An electrical contact or via is thereby formed. It is important to note that the layer 16, which was used as a masking layer, is left to add isolation to the dielectric layer 24. If layer 16 is a photoresist material, leaving layer 16 is not possible.

Figure 8:
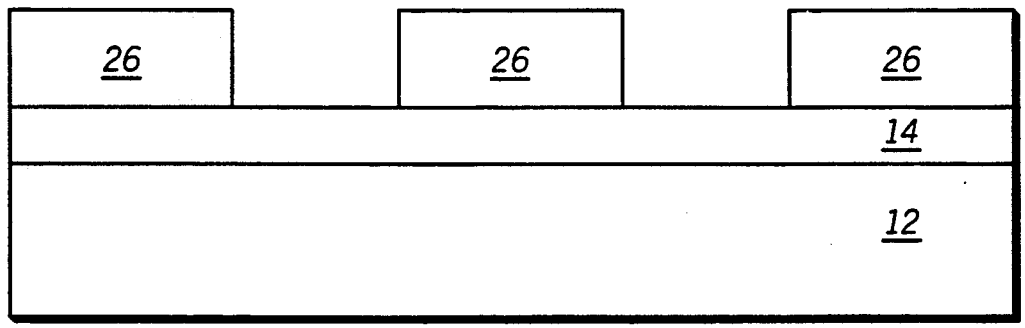
FIGS. 8–11 illustrate, in cross sectional form, another method for a patterned layer in accordance with the present invention.

In FIGS. 8-11, a structure is formed in accordance with the present invention. Elements in FIGS. 8-11 which are analogous to elements in FIGS. 1-7 are identically labeled. In FIG. 8, substrate 12 and device layer 14 are illustrated. A layer 26 is formed overlying the device layer 14. Layer 26 may be either a conductive material or a dielectric material depending upon the application. Layer 26 has a plurality of openings which are illustrated but not specifically labeled in FIG. 8.

Figure 9:
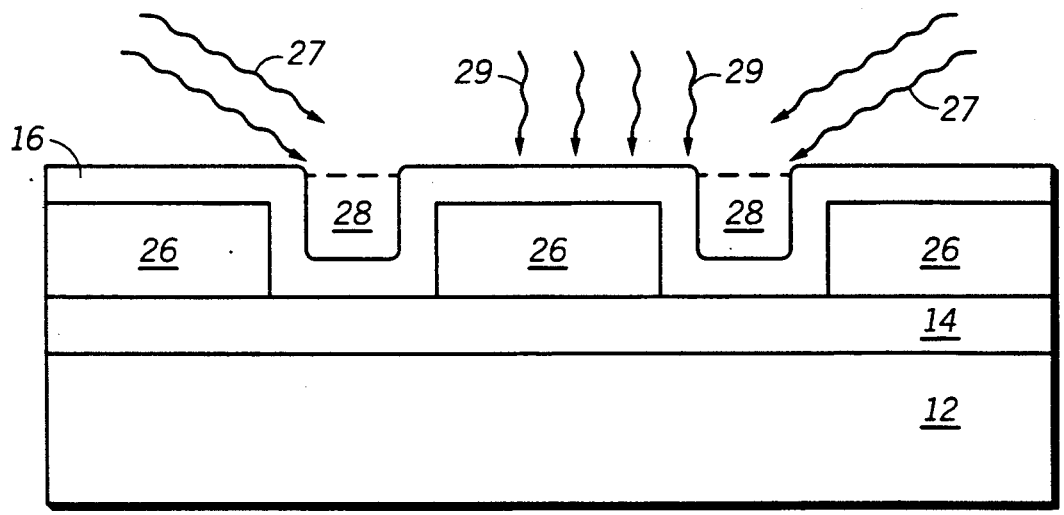

In FIG. 9, a conformal inorganic dielectric layer referred to as the layer 16 is formed over the device layer 14 and the layer 26. For example, the layer 16 may be a plasma enhanced nitride (PEN) layer. Optionally, plug regions 28 may be formed via chemical/mechanical polishing, spin-on processing, resist etch-back or the like. The plug regions 28 are formed overlying the layer 16 and within the openings in the layer 26. If the plug regions 28 are formed, either a UV light exposure 27 or a UV light exposure 29 may be used to form exposed and unexposed portions of layer 16. If the plug regions 28 are not formed, then the UV light exposure 27 must be used to avoid exposing the portions of layer 16 which lie within the openings in layer 26. A tilt angle and optionally rotated exposure process may be used to avoid exposing portions of layer 16 which lie within the openings of layer 26. Tilt angle and rotational processing, although not conventional in photolithographic processing, is used in ion implant processing in the semiconductor industry.

Figure 10:
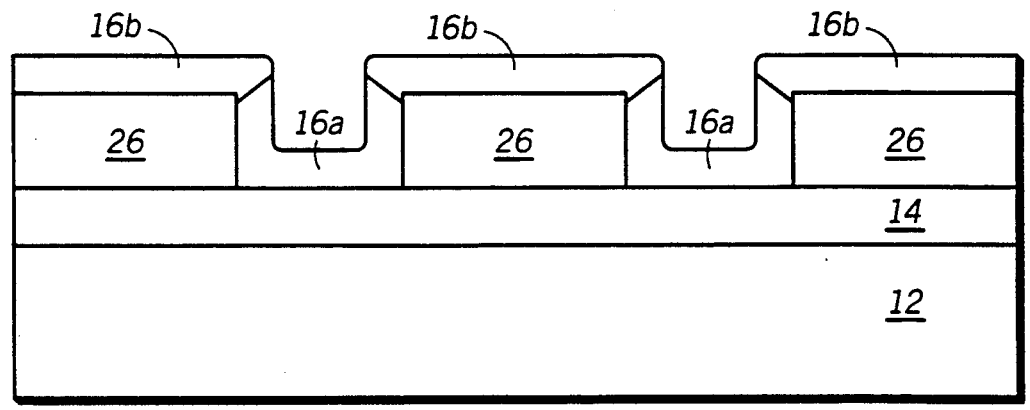

FIG. 10 illustrates the exposed regions 16b and the unexposed regions 16a which result from the UV exposure illustrated in FIG. 10. The unexposed regions 16a lie within the openings in the layer 26.

Figure 11:
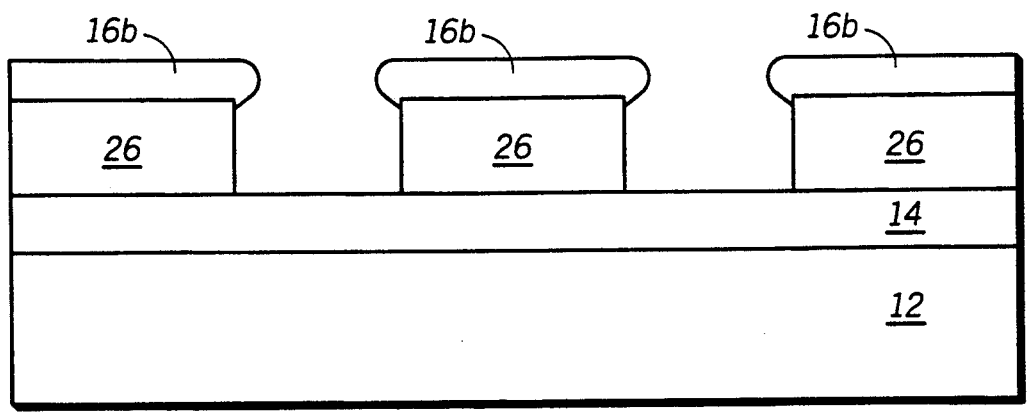

In FIG. 11, the unexposed areas 16a are removed via the etch processing taught herein. The remaining exposed areas 16b may be used to form self-aligned regions to the openings in layer 26. Sidewall contacts, selectively processed structures, and other structures may be manufactured using the process illustrated in FIGS. 8-11.

Figure 12:
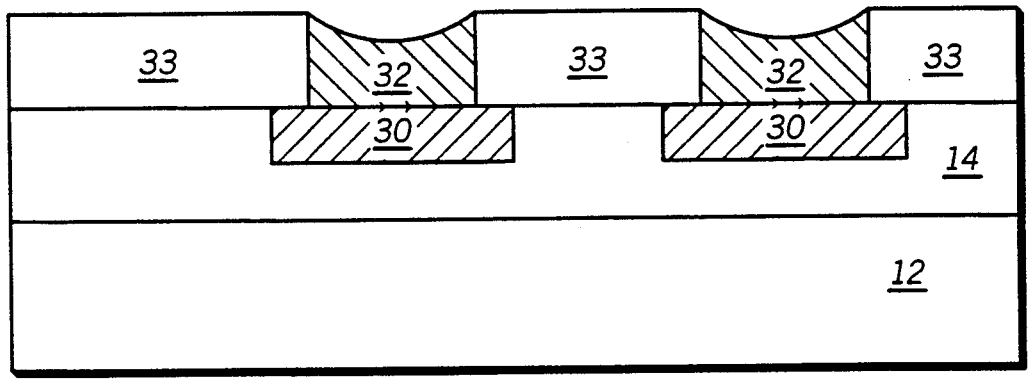
FIGS. 12–16 illustrate, in cross-sectional form, a method for forming a self-aligned contact opening or via opening in accordance with the present invention.

FIGS. 12-16 illustrate a method for forming a patterned layer in the form of a self-aligned contact/via opening in accordance with the present invention. Elements in FIGS. 12-16 which are analogous to elements in FIGS. 1-7 are identically labeled. The substrate 12 and the device layer 14 are illustrated in FIG. 12. A conductive layer 30 is formed and patterned/etched as illustrated. It is important to note that many methods exist to form contiguous conductive interconnects and any interconnect formation method may be used in FIG. 12. In addition, many conductive materials exist in the art, all of which may be used in FIG. 12 to form conductive layer 30. A dielectric layer 33 is formed overlying the device layer 14. The dielectric layer 33 has openings which are not labeled. These openings form contact/via openings which expose portions of the conductive layer 30.

In FIG. 12, a conductive plug region 32 is formed within the openings in dielectric layer 33. Etch-back processing or polishing of the material used to form the plug region 32 results in a top surface of plug region 32 which has a non-planar topography. In fact, the topography of the combination of dielectric layer 33 and plug region 32 has sidewalls, low portions, high portions, and other non-planar features. The plug region 32 may have a silicided material portion such as titanium silicide and like silicides. The plug region 32 may be a tungsten plug, a composite metal material, any metal material, a refractory metal, polysilicon, amorphous silicon, titanium nitride, titanium-tungsten, or like plug materials. Plug region 32 may also include known barrier layers, etch stop layers, diffusion barrier materials, anti-reflective coating (ARC) layers, and the like.

Figure 13:
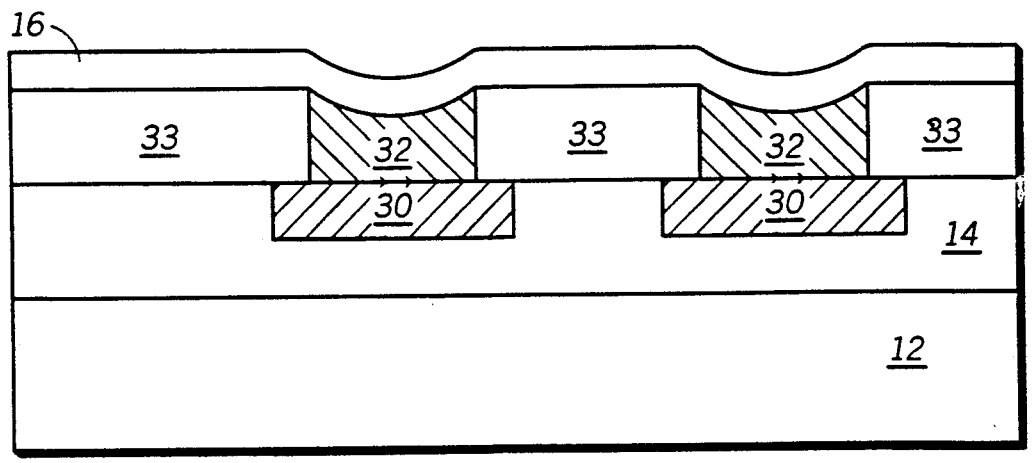

In FIG. 13, layer 16 is formed conformally over the topography created by the combination of dielectric layer 33 and the plug region 32. Preferably, layer 16 is a PEN nitride material or a like inorganic dielectric.

Figure 14:
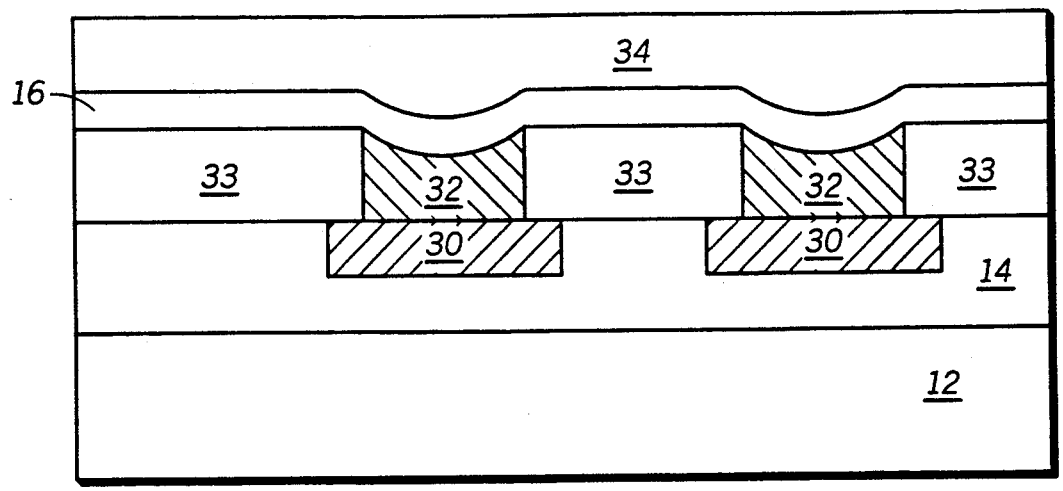

In FIG. 14, a layer of material 34 is formed over the layer 16. The layer of material 34 may be deposited, formed by spin-on glass (SOG) processing, or the like. The layer of material 34 may be any material which is substantially insensitive to UV light. Typically, layer of material 34 is a ruthenium oxide, germanium oxide, or a like dielectric layer, although some conductive materials, such as titanium nitride, are insensitive to UV exposure. The layer of material 34 should be a material which can be removed selectively to layer 16, such as a water soluable material.

Figure 15:
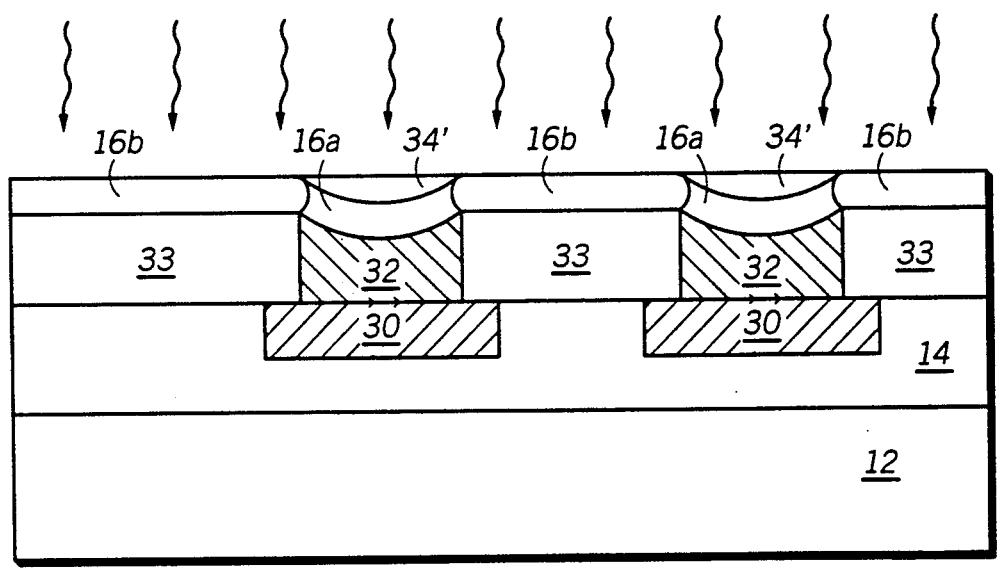

In FIG. 15, the layer of material 34 is polished and/or planarized via resist etch-back processing or chemical mechanical polishing (CMP). The polishing or planarization forms plug regions 34' from the layer of material 34. The plug regions 34' overlie the plug region 32 as illustrated in FIG. 15. A UV light exposure is performed to form exposed regions 16b and unexposed regions 16a of layer 16. Plug regions 34' function as a masking layer for layer 16 due to the fact that plug regions 34' are insensitive to UV light. The processing illustrated in FIG. 15 which is performed on layer 16 is similar to the process illustrated in FIGS. 1-3.

Figure 16:
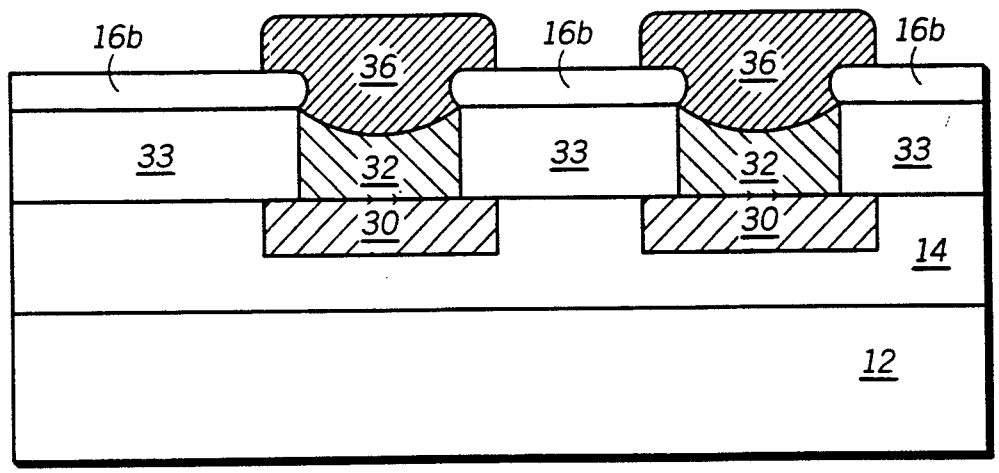

In FIG. 16, the plug regions 34' are removed by conventional etch processing. The unexposed regions 16a of layer 16 are removed as taught herein. Self-aligned contact openings to the plug region 32 are formed via exposed regions 16b. A conductive layer 36 is formed to complete the electrical contact.

Figure 17:
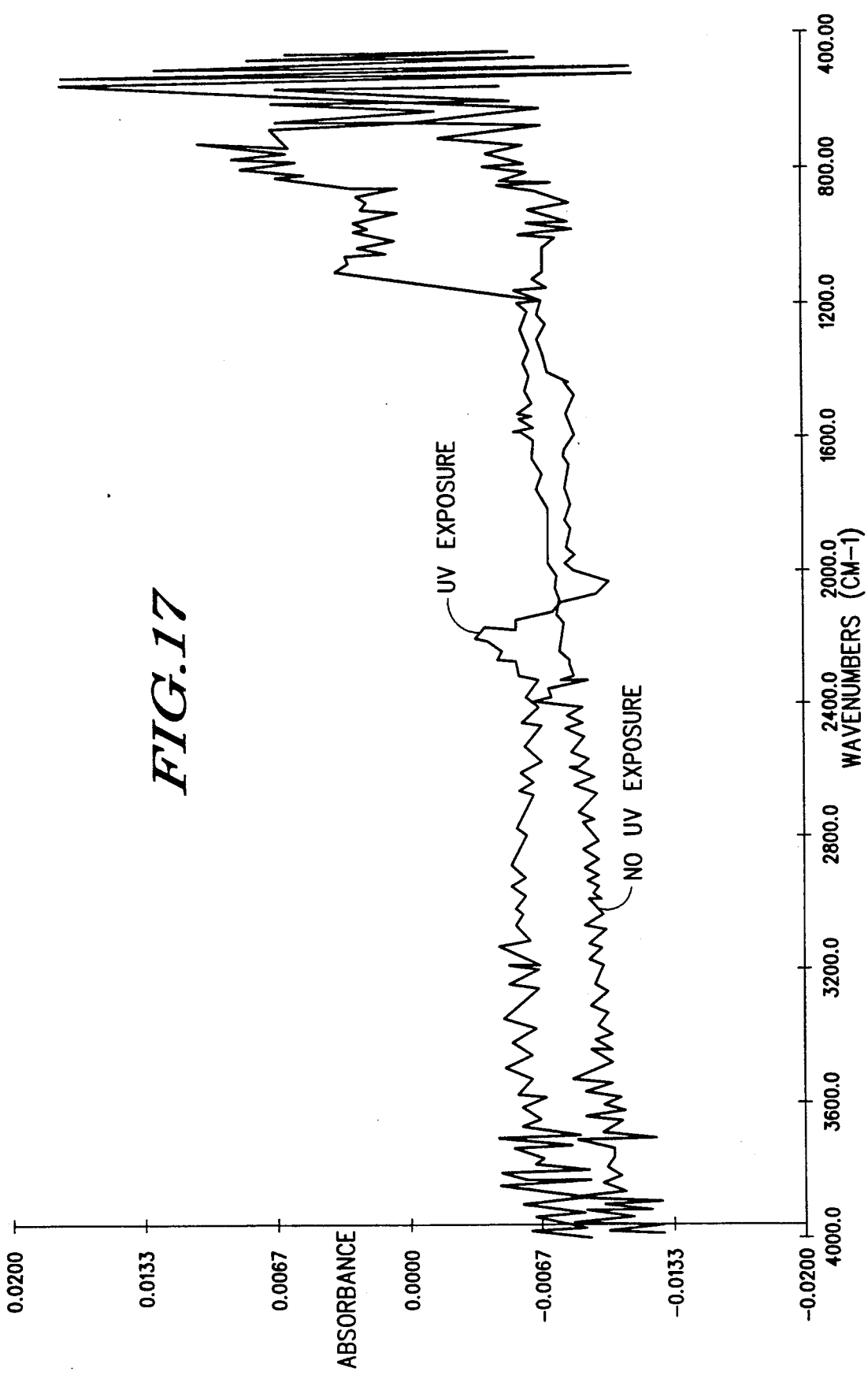
FIG. 17 illustrates in a graph that ultra-violet (UV) light has an effect an atomic bond energies of atoms within a plasma enhanced nitride (PEN) film in accordance with the present invention.

FIG. 17 illustrates that UV light exposure does affect the atomic bond energies of PEN layers. FIG. 17, illustrates a Fourier transform infra-red (FTIR) plot taken of a PEN film portion having "no UV exposure" and a second PEN nitride film portion having "UV exposure." Changes in the atomic bonding energies which result in nitride film etch variations are readily distinguishable in FIG. 17.

While the present invention has been illustrated and described with reference to specific embodiments, further modifications and improvements will occur to those skilled in the art. For example, the methods disclosed herein may be used to manufacture not only integrated circuits, but flat panel displays, circuit boards, and other related technologies. The etch chemistry taught herein to form the inorganic dielectric masking layer may vary depending on equipment and application. Many inorganic dielectric, nitride materials, or hydrogen containing materials may be used for a UV sensitive masking layer. The methods taught herein may be used to form contacts, form vias, form isolation structures, form self-aligned interconnects, or form many integrated circuit structures. Ultra-violet (UV) light may be replaced herein by a laser, X-ray lithography, phase shifting technology, E-beam technology, or other known energy sources. The methods and materials taught herein may be used to function similar to either negative or positive photoresists. The methods taught herein may be used to form electronic devices, or may be used to form mechanical devices such as micromachines. It is to be understood, therefore, that this invention is not limited to the particular forms illustrated and that it is intended in the appended claims to cover all modifications that do not depart from the spirit and scope of this invention.

We claim:

1. A method for forming a patterned layer of material overlying an integrated circuit substrate, the method comprising the steps of:
   forming an inorganic dielectric layer overlying the integrated circuit substrate, the inorganic dielectric layer being physically modified in response to an energy source exposure;
   selectively exposing said inorganic dielectric layer to an energy source radiation wherein portions of the inorganic dielectric layer are chemically altered by the energy source radiation to create exposed inorganic dielectric layer portions and unexposed inorganic dielectric layer portions; and
   selectively removing regions of the inorganic dielectric layer to form the patterned layer of material having at least one sub-micron feature wherein the regions of the inorganic dielectric layer are selected from a group consisting of: exposed inorganic dielectric layer portions and unexposed inorganic dielectric layer portions.

2. The method of claim 1 wherein the step of selectively exposing comprises:
   exposing the inorganic dielectric layer to an ultra-violet (UV) energy source as the energy source radiation.

3. The method of claim 1 wherein the step of selectively exposing comprises:
   exposing the inorganic dielectric layer to an energy source having a wavelength less than 405 nanometers.

4. The method of claim 1 wherein the inorganic dielectric layer is formed over a surface having a non-planar topography wherein recessed regions are defined overlying the substrate, the step of selectively exposing comprising:

forming the exposed portions of the dielectric layer adjacent the recessed regions and forming the unexposed portions of the dielectric layer within the recessed regions.

5. The method of claim 4 further comprising the step of:

forming a plug region overlying the inorganic dielectric layer and at least partially within the recessed regions, said plug region functioning as a masking layer for the inorganic dielectric layer.

6. The method of claim 1 wherein the step of selectively exposing comprises:

exposing the inorganic dielectric layer to alter an atomic bonding energy between atoms in exposed portions of the inorganic dielectric layer.

7. The method of claim 1 wherein the step of forming the dielectric layer comprises:

forming the inorganic dielectric layer as a nitride layer.

8. A method for forming a patterned layer over a substrate, the method comprising the steps of:

forming a nitride layer over the substrate;
placing a mask adjacent the nitride layer;
selectively exposing the nitride layer through the mask to form both first regions of the nitride layer and second regions of the nitride layer wherein atoms which comprise the first regions of the nitride layer have a first atomic bonding energy and atoms which comprise the second regions of the nitride layer have a second atomic bonding energy, the first atomic bonding energy and the second atomic bonding energy being unequal; and
removing the first regions of the nitride layer to form said patterned layer from said nitride layer.

9. The method of claim 8 wherein the step of selectively exposing comprises:

exposing the nitride layer to an ultra-violet (UV) energy source.

10. The method of claim 8 wherein the step of selectively exposing comprises:

exposing the nitride layer to an energy source having a wavelength less than 405 nanometers.

11. The method of claim 8 wherein the nitride layer is formed over a surface having a non-planar topography wherein recessed regions are formed overlying the substrate due to the non-planar topography, the step of selectively exposing comprising:

forming the second regions of the nitride layer adjacent the recessed regions and forming the first regions of the nitride layer within the recessed regions.

12. The method of claim 11 further comprising the step of:

forming a plug region overlying the nitride layer and at least partially within the recessed regions, said plug region functioning as a masking layer for the nitride layer.

13. The method of claim 8 wherein the step of selectively exposing comprises:

exposing the nitride layer to alter an atomic bonding energy between atoms in exposed portions of the nitride layer.

14. A method for forming a patterned layer comprising the steps of:

providing a substrate;
forming a layer which is sensitive to ultra-violet (UV) light having an atomic bond energy, the layer which is sensitive to UV light overlying the substrate and being further characterized as an insulating material;
placing a mask adjacent the layer which is sensitive to ultra-violet (UV) light;
selectively exposing the layer which is sensitive to UV light to UV light having a wavelength less than 405 nanometers wherein unexposed portions of the layer which is sensitive to UV light are formed and exposed portions of the layer which is sensitive to UV light are formed, the exposed portions having altered atomic bond energies; and
removing the unexposed portions of the layer which is sensitive to UV light to form said patterned layer.

15. The method of claim 14 wherein the layer which is sensitive to UV light is formed over a surface having a non-planar topography wherein recessed regions are defined by the non-planar topography, the step of selectively exposing comprising:

forming the unexposed portions of the layer which is sensitive to UV light within the recessed regions.

16. The method of claim 15 further comprising the step of:

forming a plug region overlying the layer which is sensitive to UV light and at least partially within the recessed regions, said plug region functioning as a masking layer for the layer which is sensitive to UV light.

17. A method for forming a patterned layer comprising the steps of:

providing a substrate;
forming a topographical surface overlying the substrate, said topographical surface having high surfaces and low surfaces wherein said high surfaces and said low surfaces are separated by sidewalls, said sidewalls and said low surfaces forming recessed surface regions of the topographical surface;
forming a conformal layer of material overlying the topographical surface, said conformal layer of material forming recessed surface regions of the conformal layer of material which overlie said recessed surface regions of the topographical surface, said conformal layer of material being atomically sensitive to an energy source;
filling the recessed surface regions of the conformal layer of material with a plug material which is substantially insensitive to said energy source;
exposing portions of the conformal layer of material to energy from said energy source wherein exposed portions of the conformal layer of material are formed adjacent the plug material and unexposed portions of the conformal layer of material are formed underlying the plug material;
removing the plug material; and
removing said unexposed portions of the conformal layer of material to form said patterned layer.

18. The method of claim 17 further comprising the steps of:

forming a first conductive layer underlying the patterned layer; and
forming a second conductive layer overlying the patterned layer and electrically connected through the patterned layer to the first conductive layer.

19. The method of claim 17 wherein the step of forming a conformal layer of material comprises:

forming the conformal layer of material as a nitride material.

20. The method of claim 17 wherein the step of exposing portions of the conformal layer of material comprises:
 exposing portions of the conformal layer of material to ultra-violet (UV) light.

21. The method of claim 17 wherein the step of filling the recessed surface regions comprises:
 forming the plug region as a water soluable material.

22. A method for forming an opening in a layer of material comprising the steps of:
 providing a substrate;
 forming a topographical surface overlying the substrate, said topographical surface forming a recessed region;
 forming a conformal dielectric layer as the layer of material overlying the topographical surface;
 forming a plug region overlying the conformal dielectric layer and at least partially within said recessed region;
 exposing the conformal dielectric layer to energy source radiation using the plug region as a masking layer to form first portions of the conformal dielectric layer and second portions of the conformal dielectric layer wherein the first portions are exposed to a intensity of energy unequal to the intensity of energy exposed to the second portions; and
 removing the first portions of the conformal dielectric layer to form said opening in the conformal dielectric layer.

23. The method of claim 22 further comprising the steps of:
 forming a first conductive layer underlying the opening; and
 forming a second conductive layer overlying the conformal dielectric layer and electrically connected through the opening to the first conductive layer.

24. The method of claim 22 wherein the step of forming a conformal dielectric layer comprises:
 forming the conformal dielectric layer as a nitride material.

25. The method of claim 22 wherein the step of exposing the conformal dielectric layer to energy source radiation comprises:
 exposing portions of the conformal dielectric layer to ultra-violet (UV) light.

26. The method of claim 22 wherein the step of forming a plug region comprises:
 forming the plug region as a water soluable material.

27. The method of claim 22 wherein the step of forming a plug region comprises:
 forming a contiguous layer of plug material over the conformal dielectric layer; and
 planarizing the contiguous layer of plug material to form the plug region within the recessed region.

28. The method of claim 27 wherein the step of planarizing the contiguous layer of plug material comprises:
 using a process selected form a group consisting of: chemical mechanical polishing (CMP) and resist etch back processing.

29. A method of forming an integrated circuit having a patterned layer overlying a substrate, the integrated circuit having at least one sub-micron feature, the method comprising the steps of:
 forming an inorganic layer of material overlying said substrate;
 selectively exposing said inorganic layer of material to an energy source to form exposed and unexposed portions of the inorganic layer of material; and
 exposing a portion of said inorganic layer of material to an etchant wherein the unexposed portions are removed at a first etch rate which is different from a second etch rate of the exposed portions.

30. The method of claim 29 wherein the inorganic layer of material is further characterized as being a dielectric material.

31. The method of claim 29 wherein the inorganic layer of material is further characterized as being a nitride material.

32. The method of claim 29 wherein the step of selectively exposing said inorganic layer of material to an energy source comprises:
 exposing said inorganic layer of material to ultra-violet (UV) light.

33. A method of forming a patterned layer having at least one sub-micron feature overlying an integrated circuit substrate, the method comprising the steps of:
 forming an inorganic dielectric layer of material overlying said substrate; and
 selectively exposing said inorganic dielectric layer of material to an energy source to form exposed portions of the inorganic dielectric layer of material and unexposed portions of the inorganic dielectric layer of material, said exposed portions having a first atomic bond energy which is different from a second atomic bond energy of the unexposed regions.

34. The method of claim 33 further comprising the step of:
 exposing a portion of said inorganic dielectric layer of material to an etchant wherein the unexposed portions are removed at an etch rate which is different from an etch rate of the exposed portions.

35. The method of claim 33 wherein the inorganic dielectric layer of material is further characterized as being a nitride material.

36. The method of claim 33 wherein the step of selectively exposing said inorganic dielectric layer of material to an energy source comprises:
 exposing said inorganic dielectric layer of material to ultra-violet (UV) light.

37. A method of forming a patterned layer overlying a silicon substrate, the method comprising the steps of:
 forming a layer of material overlying the substrate, said layer of material containing a hydrogen atom and a second atom which are bonded together by a first hydrogen atomic bond energy; and
 selectively exposing said layer of material to an energy source to form exposed portions of the layer of material and unexposed portions of the layer of material, said exposed portions being characterized as having a second hydrogen atomic bond energy which is different from the first hydrogen atomic bond energy of the unexposed regions.

38. The method of claim 37 wherein the step of forming a layer of material overlying the substrate comprises:
 exposing the layer of material to a gas which comprises hydrogen atoms.

39. The method of claim 38 wherein the step of exposing the layer of material to a gas comprises:
 exposing the layer of material to a gas comprising ammonia.

* * * * *